US006319564B1

(12) United States Patent
Naundorf et al.

(10) Patent No.: US 6,319,564 B1
(45) Date of Patent: Nov. 20, 2001

(54) CONDUCTOR TRACK STRUCTURES ARRANGED ON A NONCONDUCTIVE SUPPORT MATERIAL, ESPECIALLY FINE CONDUCTOR TRACK STRUCTURES, AND METHOD FOR PRODUCING THE SAME

(76) Inventors: Gerhard Naundorf, Auf der Balsterhoehe 9a, D-32657 Lemgo; Horst Wissbrock, Schwanoldstrasst 1a, D-32760 Detmold, both of (DE)

( * ) Notice: Subject to any disclaimer, the term of this patent is extended or adjusted under 35 U.S.C. 154(b) by 0 days.

(21) Appl. No.: 09/242,107
(22) PCT Filed: Jun. 3, 1998
(86) PCT No.: PCT/EP98/03303
§ 371 Date: May 16, 1999
§ 102(e) Date: May 19, 1999
(87) PCT Pub. No.: WO98/55669
PCT Pub. Date: Dec. 10, 1998

(30) Foreign Application Priority Data

Jun. 6, 1997  (DE) ............................................... 197 23 734

(51) Int. Cl.[7] ...................................................... B05D 3/06
(52) U.S. Cl. ............................ 427/531; 427/229; 427/286
(58) Field of Search .................................... 428/621, 670, 428/652; 427/531, 229, 286

(56) References Cited

U.S. PATENT DOCUMENTS

| 3,438,805 | 4/1969 | Potrafke ................................. 117/130 |
| 3,791,340 | 2/1974 | Ferrara . |
| 3,993,807 | 11/1976 | Stabenow et al. . |
| 4,574,095 | 3/1986 | Baum et al. . |
| 4,900,581 | 2/1990 | Stuke et al. . |

FOREIGN PATENT DOCUMENTS

| AS 1267839 | 5/1968 | (DE) . |
| OS 3922233 | 1/1991 | (DE) . |
| OS 4124686 | 1/1992 | (DE) . |
| 4210400 | 1/1993 | (DE) . |
| 0 180 101 | 10/1985 | (EP) . |

*Primary Examiner*—Deborah Jones
*Assistant Examiner*—Jason Savage
(74) *Attorney, Agent, or Firm*—Crowell & Moring LLP

(57) ABSTRACT

Conductor track structures arranged on a nonconductive support material, especially fine conductor track structures, composed of a heavy-metal base and a metallization layer applied to the base, and a method for producing the conductor track structures. The heavy-metal base contains heavy metal nuclei which are formed by breaking down a nonconductive heavy metal complex by using UV radiation produced by an excimer laser. The heavy metal complex is applied to the entire microporous surface of the support material and covers the surface of the support material in the area of the conductor track structures. Conductor track structures produced according to the invention are comparatively easier to produce than previously known conductor track structures and exhibit very good adhesion.

18 Claims, No Drawings

CONDUCTOR TRACK STRUCTURES ARRANGED ON A NONCONDUCTIVE SUPPORT MATERIAL, ESPECIALLY FINE CONDUCTOR TRACK STRUCTURES, AND METHOD FOR PRODUCING THE SAME

BACKGROUND OF THE INVENTION

The invention relates to conductor track structures on a nonconductive support material, especially fine conductor track structures, and a method for producing the conductor track structures Through the article, "LAD—A novel, laser-supported coating process for fine conductor metallization" from No. 10, vol. 81 (1990), of the technical journal "Galvanotechnik," it has become known to apply Pd acetate from a solution as a thin film on the full surface of a nonconductive support material in order to produce fine conductor structures of definitely less than 100 mm. By subsequent exposure to laser light by means of an excimer laser with a wavelength of 248 nm in the area of the conductor structures that are to be produced, metal atoms are then released as nuclei for a subsequent nonelectrical metallization. Before the metallization, however, it is necessary to perform a rinse to remove the undecomposed areas of the metal-containing film applied to the support material. The quality of this rinse process plays a decisive part for the avoidance of wild growth problems in the subsequent nonelectrical metallization. Moreover it has been found that, by means of the method described it is not possible to achieve sufficient strength of adhesion of the deposited metal conductor tracks.

In DE 42 10 400 C1 a method is disclosed for the direct deposition of copper from a film of a mixture of heavy metal salts applied to a substrate by local heating by means of a laser. This method lies in the field of thermally activated chemistry, with the disadvantage that the fineness of the conductor track structures that can be achieved is limited. Furthermore, the applied film is an electrically conductive film, so that before the metallization a complicated and problematical rinsing process is necessary. The use of a nonconductive heavy metal complex and a cold break-up of the heavy metal complex by means of an excimer laser-UV radiation in order to split off the heavy metal atoms is neither disclosed nor suggested.

In DE 41 24 686 A1 there is described, among other things, a process in which a structured deposition of copper from a gas phase containing an organic copper-heavy metal complex is performed on a substrate by means of the action of laser radiation energy. The great disadvantage of this process is that the structured deposition of the copper takes place in a vacuum chamber with an inert gas atmosphere. The high cost of apparatus and technical labor is an obstacle to a wide use of this process in the area of conventional circuit boards and printed circuits.

U.S. Pat. No. 4,574,095 discloses a method in which a substrate is exposed in a vacuum chamber to the vapor of a palladium complex compound and is then irradiated through a window with a 249 nm excimer laser to produce a structure. Since the deposition of palladium takes place from a vapor phase in a vacuum chamber, this process also is so expensive that its use in the field of conventional circuit boards and printed circuits is not economical.

SUMMARY OF THE INVENTION

It is the object of the invention to make available fine conductor track structures of electrical circuits that are simple and sure to produce, and also to provide a simplified and sure method for producing the conductor track structures which will reliably assure a fine structuring of the conductor tracks down to conductor path widths and spacings of 10 $\mu$m.

This object is achieved by the. track structure and production method of the invention as described hereinafter. The additional embodiments of the invention are to be found in the corresponding dependent claims.

The conductor track structures according to the invention are easier to produce than conventional conductor path structures. Since the heavy metal containing basis of the support material contains heavy metal nuclei which have formed by the breaking up of an electrically nonconductive organic heavy metal complex applied to a microporous surface of the support material, it is not necessary, in order to avoid wild growth problems, to remove the untreated areas of the heavy metal containing basis before the metallization. Furthermore, an outstanding adhesion of the deposited metal conductor tracks is achieved.

DETAILED DESCRIPTION OF THE INVENTION

Because a nonconductive organic heavy metal complex is utilized as the heavy metal containing component which is to be applied to the support material in the method of the invention for producing conductor track structures, it is achieved that the chemical reductive metallization can take place immediately after the action of the excimer laser-UV radiation. Due to the action of the excimer laser UV radiation, a break-up of the heavy metal complex takes place in the area of the conductor track structures to be produced, so that highly reactive heavy metal nuclei are split off for the partially reductive metallization. An always problematic rinsing process is not necessary. The metallization nevertheless takes place without any wild growth, with the formation of very sharp contours. Since the heavy metal nuclei that are formed are highly reactive, the desired precise metallization in the necessary thickness is additionally promoted.

Preferably, a Pd complex or a Pd-containing heavy metal complex is used. It has been found that such heavy metal complexes are especially well suited for fine structuring by the method of the invention. In particular, a substantially lower energy density of ultraviolet radiation is sufficient to initiate the structuring cleavage reaction, than is needed for ablation or also for starting the mechanism of action described as decomposition in known systems. Also, as a consequence of this low energy input, no ablative particles occur, so that cleaning processes before the metallization can be omitted. In addition it is brought about that in connection with the structuring, substantially larger areas can be illuminated per laser pulse than in known ablation techniques.

Within the scope of the invention it is additionally envisioned that in order to split off the heavy metal nuclei from the heavy metal complex, a Kr F excimer laser with a wavelength of 248 nm is preferably used. It is thus possible to carry out the cleavage without heating up the complex. Thus any melting of materials in the work area is avoided. The consequence is a very high edge sharpness of the areas with cleaved-off heavy metal nuclei and as a result a very high, extremely advantageous edge sharpness in the metallized structures, which is of great importance especially in the case of fine conductors.

According to a preferred embodiment, palladium diacetate is reacted with an organic complexing agent to form a Pd complex. It has been found that it is advantageous if a known, highly stable, polyfunctional chelating agent with a number of ligand atoms, such as N, O, S, P, is used as the organic complexing agent. Within the scope of the invention it is furthermore provided that the polyfunctional chelating agent can also be used together with ionizing groups, such as hydroxyl or carboxyl groups.

Especially, molecular combinations of sterically hindered aromatic compounds and metal-complexing groups can be used as organic complexing agents. Preferably, an organic complexing agent is used having the formula

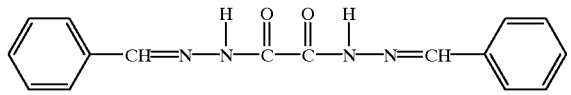

Basically, the heavy metal complex is to be applied dissolved in a solvent, preferably dimethyl formamide in the case of a Pd complex, to a porous support material or to a support material with a porous surface. In this case it can be, for example, a flexible polyimide film with a microporous surface, or else paper. The Pd complex can penetrate into the pores of the material. In the subsequent metallization the pore structure is advantageous for the adhesion of the conductor track, into which the, for example, copper used in the metallization can grow and interengage like a root. The very fine structures that can be achieved are favored by the fact that no adhesion promoter coat is necessary and hence there is no minimum limit to possible conductor track widths from that source. In addition, the excimer laser UV radiation, due to its short wavelength, makes possible very fine, sharply configured structures with metallization nuclei.

As an alternative, the heavy metal complex may be mixed into a binding agent which forms a porous structure and then applied as a coating on the supporting material. On account of its great ease of handling and reliability, such a procedure is also quite advantageous for many applications.

According to the invention, an organic nonconductive heavy metal complex is uniformly distributed on a microporous base material or mixed into a binding agent which forms a porous structure and then applied to the support material as a coating. Then the heavy metal complex is cleaved by a selectively applied excimer UV radiation only in the areas to be metallized, such that metal nuclei are formed, which then produce a metal deposition in reductive baths. This metal deposition then takes place both by rooting itself in the microporous base material, as well as by lying on its exterior. Thus a tightly adherent conductor track is formed.

The method of the invention can be used both with surface application of laser radiation and a masking technique in a streamlined mass production, as well as without masking through a, for example, numerically controlled guidance of a point-focused laser beam for use in the production of prototypes or small-series production.

In the following the invention will be explained with reference to a working embodiment.

2.24 mass-parts of palladium diacetate are dissolved in 100 mass-parts of dimethyl formamide. Also, 2.94 mass parts of the organic complexing agent of the formula

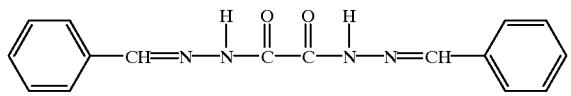

are introduced into 800 mass-parts of dimethyl formamide and dissolved by heating. Both solutions are then mixed and caused to react. Immediately thereafter, before the solution cools and the palladium complex precipitates, a microporous polyimide film is imbibed in the solution. After 10 hours of drying at room temperature, the resulting base material is exposed through a mask to a KrF excimer laser, i.e., an excimer laser with a wavelength of 248 nm. In the irradiated areas, very finely divided metallic palladium is thereby cleaved out of the complex. In a conventional, commercially available, reductive copper bath without externally applied electrical current, strongly anchored copper deposits itself selectively in the irradiated areas. The conductor tracks are formed, and a ready-to-use flexible circuit is obtained.

It has been found that the method according to the invention can also be used for applying conductor track structures on circuit boards which are composed of other nonconductive materials with a microporous surface, such as ceramic base materials, or also glass, for example.

What is claimed is:

1. A method for producing a conductor track structure, said method comprising the steps of:
    applying a coating containing a nonconductive organic heavy metal complex to a microporous surface of a nonconductive support structure;
    selectively breaking up the nonconductive organic heavy metal complex in conductor track areas and releasing heavy metal nuclei in said conductor track areas; and
    thereafter metallizing the conductor track areas by chemical reduction.

2. A method according to claim 1, wherein said organic heavy metal complex contains Pd.

3. A method according to claim 1, wherein said organic heavy metal complex is a Pd complex.

4. A method according to claim 3, wherein said Pd complex is formed by reaction of a palladium salt with an organic complexing agent.

5. A method according to claim 4, wherein said organic complexing agent comprises, in molecular combination, sterically hindered aromatic groups and metal-complexing groups.

6. A method according to claim 4, wherein said organic complexing agent is a compound corresponding to the formula

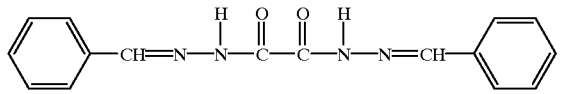

7. A method according to claim 3, wherein said Pd complex is formed by reaction of palladium acetate with an organic complexing agent and subsequent crystallization of a resulting Pd complex.

8. A method according to claim 7, wherein said organic complexing agent comprises a stable, polyfunctional chelating agent containing a plurality of ligand atoms selected from the group consisting of N, O, S and P.

9. A method according to claim 8, wherein said chelating agent is used in conjunction with ionizing groups.

10. A method according to claim 9, wherein said ionizing groups are hydroxyl or carboxyl groups.

11. A method according to claim 1, wherein said organic heavy metal complex is dissolved in a solvent and applied in solvent solution to the microporous surface of said support material.

12. A method according to claim 11, wherein said support material having a microporous surface is a polyimide membrane film.

13. A method according to claim 11, wherein said solvent is dimethyl formamide or ethyl acetate.

14. A method according to claim 1, wherein the heavy metal complex is mixed into a binding agent which forms a porous coating and then is applied as coating to the support material.

15. A method according to claim 1, wherein said excimer laser is a KrF excimer laser which emits at a wavelength of 248 nm.

16. A method according to claim 1, wherein said breaking up the nonconductive organic heavy metal complex is by application of UV radiation.

17. A method according to claim 1, wherein said breaking up the nonconductive organic heavy metal complex is by application of radiation from an excimer laser.

18. A method according to claim 1, wherein rinsing of the nonconductive support structure is not conducted before said metallizing.

* * * * *